(12) United States Patent
Mai et al.

(10) Patent No.: US 11,509,222 B2
(45) Date of Patent: Nov. 22, 2022

(54) VOLTAGE CONVERTER WITH LOOP CONTROL

(71) Applicant: TEXAS INSTRUMENTS INCORPORATED, Dallas, TX (US)

(72) Inventors: Junjie Mai, Beijing (CN); Weibing Jing, Beijing (CN); Jian Guo, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 157 days.

(21) Appl. No.: 17/130,799

(22) Filed: Dec. 22, 2020

(65) Prior Publication Data
US 2022/0200451 A1 Jun. 23, 2022

(51) Int. Cl.
*H02M 3/158* (2006.01)
*H02M 1/088* (2006.01)
*H03K 3/037* (2006.01)

(52) U.S. Cl.
CPC .......... *H02M 3/158* (2013.01); *H02M 1/088* (2013.01); *H03K 3/037* (2013.01)

(58) Field of Classification Search
CPC ....... H02M 3/158; H02M 1/088; H02M 3/157
See application file for complete search history.

(56) References Cited

U.S. PATENT DOCUMENTS

| | | | |
|---|---|---|---|
| 9,362,822 B2 * | 6/2016 | Rozek | H02M 3/156 |
| 2017/0201174 A1 * | 7/2017 | Li | H02M 1/08 |

* cited by examiner

*Primary Examiner* — Adolf D Berhane
*Assistant Examiner* — Afework S Demisse
(74) *Attorney, Agent, or Firm* — Michael A. Davis, Jr.; Charles A. Brill; Frank D. Cimino

(57) ABSTRACT

A voltage converter system includes a switch configured to switch between first and second states responsive to a first control signal. Timer circuitry is configured to generate a timing signal representing a duration of the first state based on input and output voltages of the voltage converter system. Control logic is coupled to the switch and the timer circuitry, and configured to generate the first control signal based on a second control signal. The second control signal is based on a feedback voltage and a reference voltage. Timer control circuitry is coupled to the control logic and the timer circuitry, and configured to: detect a phase difference between the first control signal and the second control signal; and adjust the timer circuitry to change the duration based on the phase difference.

17 Claims, 10 Drawing Sheets

VOLTAGE CONVERTER WITH LOOP CONTROL

TECHNICAL FIELD

This description relates generally to integrated circuits, and more particularly to a voltage converter system with loop control.

BACKGROUND

DC-DC voltage converters are useful to convert an input DC voltage to a desired output DC voltage to drive a load. A DC-DC converter may include a feedback loop that determines on or off time of a switch in each switching cycle based on a feedback voltage and a reference voltage, thereby regulating an output voltage of the DC-DC converter. In a conventional adaptive on-time or off-time mode DC-DC converter, a pulse-width-modulation (PWM) signal that controls the switch is regulated based on the feedback voltage, and the on-time or off-time is determined based on input and output voltages of the DC-DC converter.

SUMMARY

A voltage converter system includes a switch configured to switch between first and second states responsive to a first control signal. Timer circuitry is configured to generate a timing signal representing a duration of the first state based on input and output voltages of the voltage converter system. Control logic is coupled to the switch and the timer circuitry, and configured to generate the first control signal based on a second control signal. The second control signal is based on a feedback voltage and a reference voltage. Timer control circuitry is coupled to the control logic and the timer circuitry, and configured to: detect a phase difference between the first control signal and the second control signal; and adjust the timer circuitry to change the duration based on the phase difference.

DETAILED DESCRIPTION OF EXAMPLE EMBODIMENTS

This description relates to DC-DC converter systems with loop control.

Figure 1:
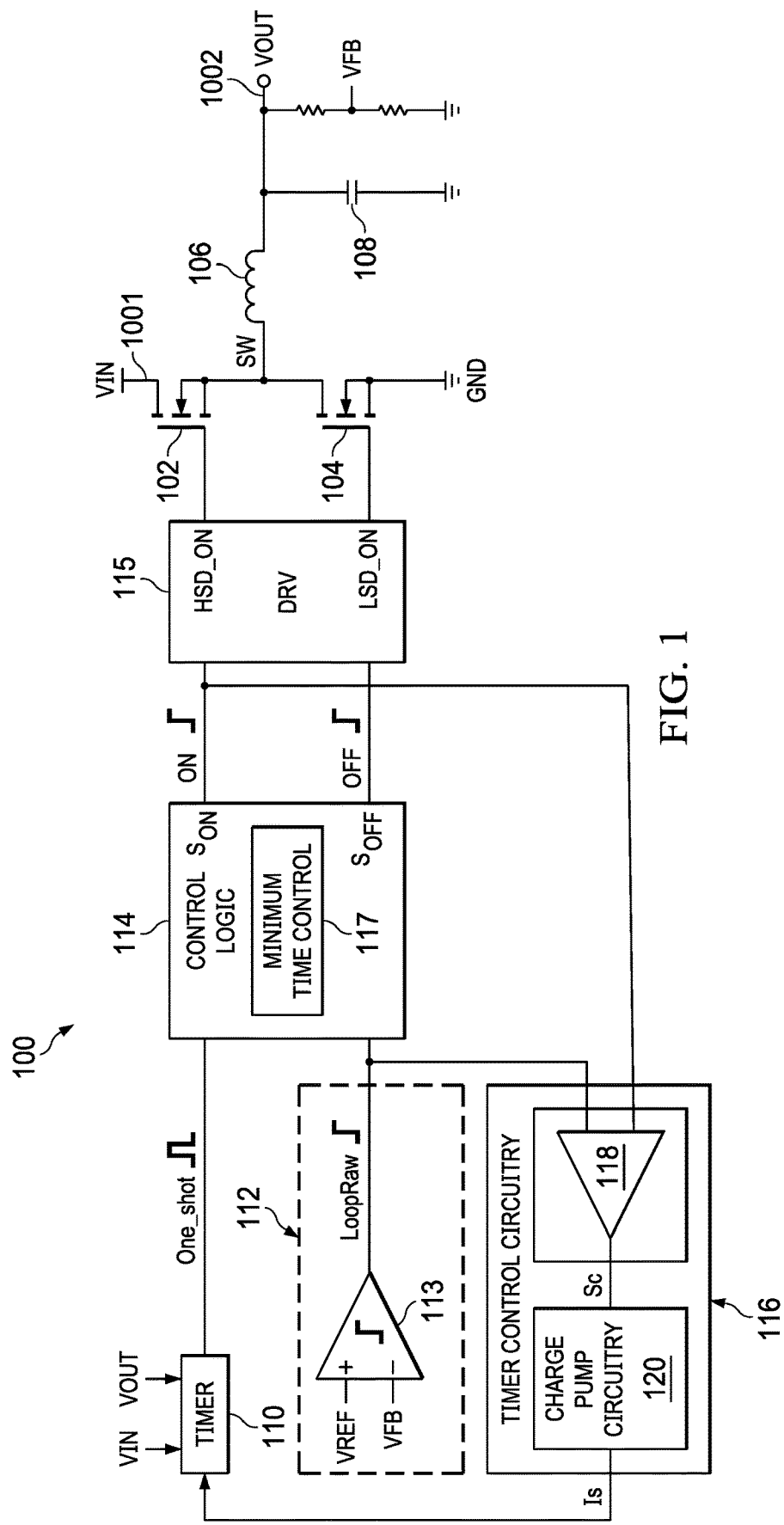
FIG. 1 is a schematic block diagram of a DC-DC converter system in accordance with an implementation of this description.

FIG. 1 is a schematic block diagram of a DC-DC converter system 100 in an implementation of this description. More particularly, FIG. 1 shows a buck DC-DC converter system to convert an input voltage VIN to an output voltage VOUT at a target voltage level.

The system 100 includes: (a) a first switch 102 coupled between a switch terminal SW and a voltage terminal, such as an input terminal 1001 configured to receive the input voltage VIN of the system 100; and (b) a second switch 104 coupled between the switch terminal SW and a voltage supply terminal (such as a ground terminal GND), thereby allowing a current flowing from the input terminal 1001 to the switch terminal SW when the first switch 102 is at a first state (such as an on state) and the second switch 104 is at a second state (such as an off state), and allowing a current flowing from the switch terminal SW to the ground terminal when the second switch 104 is on. The first and second switches 102 and 104, also named respectively as high side and low side switches, can be transistors, such as metal oxide semiconductor field effect transistors (MOSFETs), which are respectively controlled by gate drive signals HSD_ON and LSD_ON to alternately operate in the first and second states. The system 100 also includes: an output inductor 106 coupled between the switch terminal SW and an output voltage terminal 1002; and an output capacitor 108 coupled between the output voltage terminal 1002 and the ground terminal GND.

In one example, the system 100 includes timer circuitry 110 configured to receive the input and output voltages VIN and VOUT of the system 100, and configured to determine a first duration Ton of the first state of the first switch 102 based on the input and output voltages VIN and VOUT and a target switching frequency Fsw_target of the system 100. The timer circuitry 110 is configured to generate a timing signal when the first duration expires. In one example, the timing signal is a one shot signal One_shot. The timing signal One_shot is configured to switch the first switch 102 from the first state to the second state. In one example, the timer circuitry 110 includes a timing capacitor (not shown), and the first duration Ton is determined by charging the timing capacitor based the on input and output voltages VIN and VOUT. The first duration Ton of the on state of the first switch 102 is provided in accordance with the equation below:

$$Ton = Tsw\_target \cdot \frac{VOUT}{VIN} \quad (1)$$

where Tsw_target is a target switching cycle (Tsw_target=1/Fsw_target) of the system 100, and Fsw_target is the target switching frequency of the system 100. A ratio between the first duration Ton and an actual switching cycle of the system 100 defines a switching duty cycle of the system 100. The output voltage VOUT is generated based on the switching duty cycle and the input voltage VIN.

The system 100 also includes loop control circuitry 112 configured to generate a loop control signal LoopRaw based on: a feedback voltage VFB proportional to the output voltage VOUT; and a particular reference voltage VREF. In one example, the loop control circuitry 112 includes a comparator 113 configured to: receive the feedback voltage VFB and the particular reference voltage VREF; and generate the loop control signal LoopRaw. The loop control signal LoopRaw is configured to switch the first switch 102 between the first and second states, such as from the second state to the first state. A phase difference between the timing signal One_shot and the loop control signal LoopRaw defines a target second duration of the second state of the first switch 102. The loop control circuitry 112 determines the target second duration Toff_target of the second state of the first switch 102 based on the feedback voltage VFB. The target second duration Toff_target is specified to be provided in accordance with the equation below:

$$Toff\_target = Tsw\_target - Ton \qquad (2)$$

The system 100 also includes: control logic 114 coupled to the timer circuitry 110 and the loop control circuitry 112 to respectively receive the timing signal One_shot and the loop control signal LoopRaw; and a driver unit 115 coupled between the control logic 114 and the first and second switches 102 and 104. The control logic 114 is configured to generate control signals $S_{ON}$ and $S_{OFF}$ based on the timing signal One_shot and the loop control signal LoopRaw. The control signal $S_{ON}$ is configured to assert the gate drive signal HSD_ON and de-assert the gate drive signal LSD_ON. The control signal $S_{OFF}$ is configured to de-assert the gate drive signal HSD_ON and assert the gate drive signal LSD_ON. The control logic 114 includes a minimum time control unit 117 configured to time a minimum duration Toff_min of the second state of the first switch 102. The minimum duration Toff_min is configured based on various factors of the DC-DC converter system 100, such as blanking time of inductor current IL sensing, and delay caused by the loop control circuitry 112, the control logic 114 and/or the driver unit 115. In one example, the control logic 114 is configured to assert the control signal $S_{OFF}$ to switch off the first switch 102 responsive to the timing signal One_shot, and to assert the control signal $S_{ON}$ to switch on the first switch 102 when the loop control signal LoopRaw is asserted and the minimum duration Toff_min of the second state of the first switch 102 expires. Therefore, when the minimum duration Toff_min is greater than the target second duration Toff_target determined by the loop control circuitry 112, the control signal $S_{ON}$ is asserted based on the minimum duration Toff_min. Accordingly, the minimum duration Toff_min dominates the actual second duration Toff of the first switch. As the control signal $S_{ON}$ lags behind the loop control signal LoopRaw, the actual duration Toff of the second state of the first switch 102 is greater than the target second duration Toff_target. The first duration Ton of the first state of the first switch 102 arrives later than the time determined by the loop control signal LoopRaw, which causes a decrease of the switching duty cycle of the DC-DC converter system 100. As a result, energy generated by switching on the first switch 102 will not be sufficient to maintain the output voltage VOUT at the target voltage level.

In one example, the system 100 further includes timer control circuitry 116, coupled to the timer circuitry 110, loop control circuitry 112 and the control logic 114. The timer control circuitry 116 is configured to: (a) detect a phase difference between the control signal $S_{ON}$ and the loop control signal LoopRaw; and (b) responsive to detecting that the control signal $S_{ON}$ is lagging behind the loop control signal LoopRaw, change (such as extend) the first duration Ton by an extra duration proportional to the phase difference, in order to ensure the switching duty cycle of the DC-DC converter system 100 is large enough to maintain the output voltage VOUT at the particular voltage level. Therefore, in the converter system 100, when the minimum duration Toff_min dominates the actual duration Toff of the second state of the first switch 102: (a) the actual second duration Toff of the converter system 100 is fixed based on the minimum duration Toff_min; (b) the first duration Ton is extended proportionally to the phase difference; and (c) the switching frequency Fsw of the DC-DC converter system 100 decreases smoothly.

In one example, the timer control circuitry 116 includes a phase detector 118 configured to: receive the control signal $S_{ON}$ and the loop control signal LoopRaw; detect a phase difference between the control signal $S_{ON}$ and the loop control signal LoopRaw; and generate a charging signal Sc with a duration proportional to the phase difference. The timer control circuitry 116 also includes a charge pump circuitry 120 coupled to the phase detector 118 and configured to generate a second current Is proportional to the width of the charging signal Sc. In one example, the charge pump circuitry 120 is configured to discharge a capacitor of the timer circuitry 110 with the second current Is, in order to extend the first duration Ton.

Figure 2:
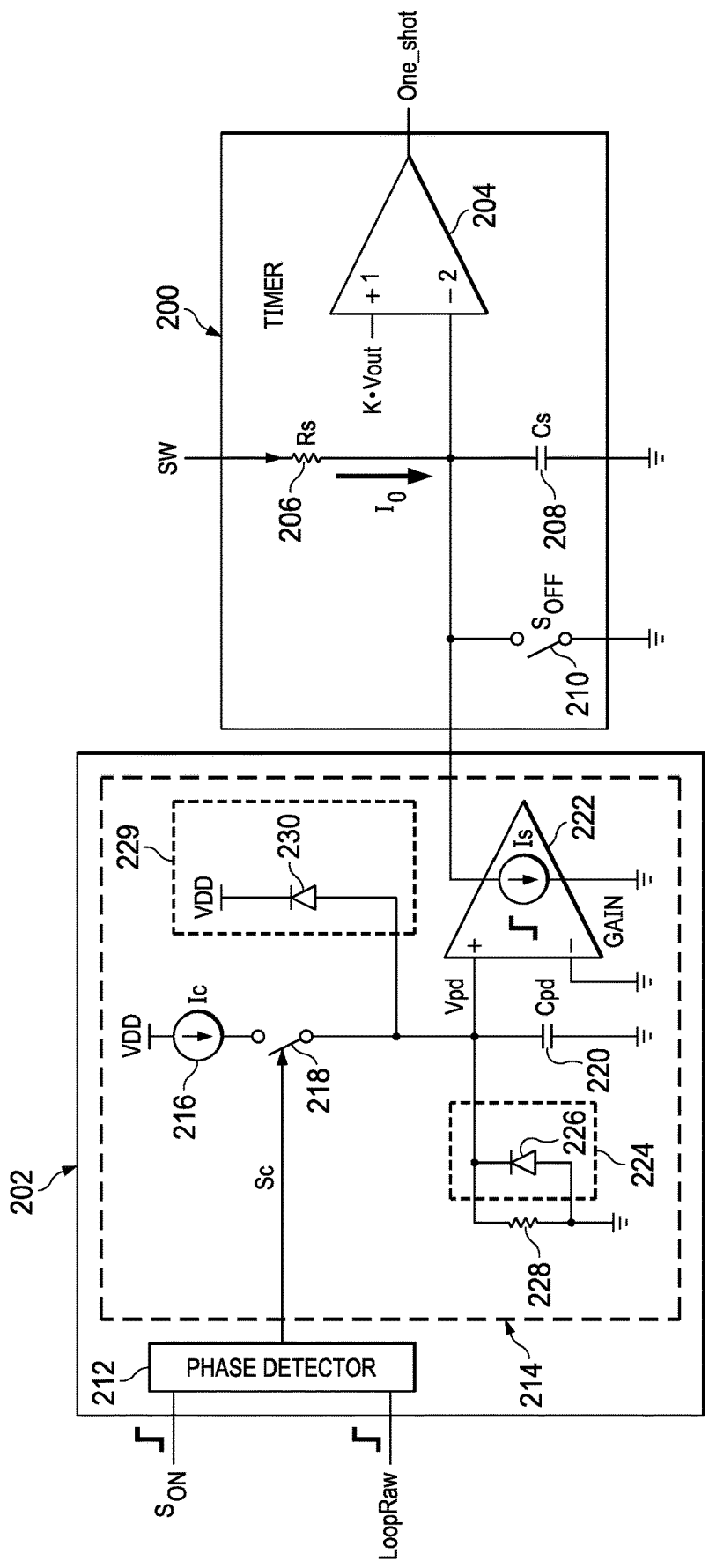
FIG. 2 is a schematic circuit diagram of timer circuitry and timer control circuitry of the DC-DC converter system of FIG. 1.

FIG. 2 is an example schematic circuit diagram of timer circuitry 200 and a timer control circuitry 202, such as the timer circuitry 110 and the timer control circuitry 116 of the DC-DC converter system 100 of FIG. 1.

The timer circuitry 200 includes a first comparator 204 having: a first input terminal (such as a non-inverting input terminal) configured to receive a voltage K·Vout proportional to the output voltage VOUT; a second input terminal (such as an inverting input terminal); and an output terminal configured to generate the timing signal One_shot. The timer circuitry 200 also includes: (a) a first resistor Rs 206 coupled between the switching terminal SW and the inverting input terminal of the first comparator 204; and (b) a first capacitor Cs 208 having a first terminal coupled to the inverting input terminal of the first comparator 204, and a second terminal coupled to a voltage supply, such as the ground terminal. The timer circuitry 200 further includes a control switch 210 coupled in parallel with the first capacitor Cs 208, and configured to short the first capacitor Cs 208 when the first switch 102 is in the second state. In one example, when the first switch 102 is in the first state (such as an on state), a charging current $I_0$ (provided from the input terminal 1001 through the switching terminal SW and the first resistor Rs 206) charges the first capacitor Cs 208. The first comparator 204 generates the timing signal when a voltage at the first terminal of the first capacitor Cs 208 increases to the voltage K·VOUT. Assertion of the timing signal One_shot causes the control logic 114 to assert the control signal $S_{OFF}$ to switch off the first switch 102 and switch on the control switch 210, in order to discharge the first terminal of the first capacitor Cs 208 to ground. The timing signal One_shot generated by the first comparator 204 is a one shot signal. The first duration Ton of the on state of the first switch 102 is provided in accordance with the equation below:

$$Ton = K \cdot Rs \cdot Cs \cdot \frac{VOUT}{VIN} \qquad (3)$$

where K·Rs·Cs is configured based on the target switching cycle Tsw_target=1/Fsw_target of the system 100, in which Fsw_target is the target switching frequency of the system 100.

The timer control circuitry 202 includes a phase detector 212, such as the phase detector 118 of the DC-DC converter system 100 of FIG. 1. In one example, the phase detector 212 is a D flip flop having: a data input terminal configured to receive the loop control signal LoopRaw from the loop control circuitry 112; and a clock input terminal configured to receive the control signal $S_{ON}$ from the control logic 114.

The phase detector 212 determines a phase difference between the loop control signal LoopRaw and the control signal $S_{ON}$, and generates the charging signal Sc with a duration (width) proportional to the phase difference. The phase detector 212 may also include other logic that: generates a first edge (such as a rising edge) of the charging signal Sc responsive to assertion of the loop control signal LoopRaw; and generates a second edge (such as a falling edge) of the charging signal Sc responsive to assertion of the control signal $S_{ON}$.

The timer control circuitry 202 includes charge pump circuitry 214, such as the charge pump circuitry 120 of the DC-DC converter system 100 of FIG. 1. The charge pump circuitry 214 includes a first current source 216 providing a first current Ic, a charging switch 218 coupled to the first current source Ic 216, and a second capacitor Cpd 220 having a first terminal coupled to the charging switch 218 and a second terminal coupled to a voltage supply, such as the ground terminal GND. The charging switch 218 is controlled by the charging signal Sc to couple the first current source Ic 216 to the second capacitor Cpd 220 for a duration based on the phase difference detected by the phase detector 212. In one example, the charging signal Sc is a pulse signal having a width proportional to the phase difference between the loop control signal LoopRaw and the control signal $S_{ON}$. In one example, the charging switch 218 is configured to be switched on during the period from the first edge to the second edge of the charging signal Sc. The charge pump circuitry 214 also includes an amplifier (such as a transconductance amplifier) 222 coupled between the first terminal of the second capacitor Cpd 220 and the inverting input terminal of the first comparator 204. The transconductance amplifier 222 is configured to: provide a second current source Is proportional to a voltage Vpd across the second capacitor Cpd 220. The second current Is provided by the second current source: (a) offsets the charging current $I_0$ received by the first capacitor 208; and (b) delays change of the first control signal. In one example, the second current Is discharges the first capacitor Cs 208, thereby proportionally extending the first duration Ton. Therefore, in the converter system 100, when the minimum duration Toff_min dominates the actual duration Toff of the second state of the first switch 102: the actual second duration Toff of the converter system 100 is fixed based on the minimum duration Toff_min; the first duration Ton is extended proportionally to the phase difference; and the switching frequency Fsw of the DC-DC converter system 100 decreases smoothly.

In one example, the first current source Ic, capacitance of the second capacitor Cpd 220, and gain of the transconductance amplifier 222 are provided in accordance with the equation below:

$$\Delta Is = \alpha \cdot I_0 = \text{Gain} \cdot \Delta Vpd = \text{Gain} \cdot \frac{Ic \cdot T_{pd}}{C_{pd}} \quad (4)$$

where $I_0$ is an original charging current through the first resistor Rs 206 to charge the first capacitor Cs 208, α is a target step for adjusting the first duration Ton (e.g., α=0.03%) to ensure smooth change, Gain is a gain of transconductance amplifier 222, and $T_{pd}$ can be set maximally to be the minimum duration Toff_min of the second state of the first switch 102.

In one example, the charge pump circuitry 214 further includes first clamping circuitry 224 coupled to the first terminal of the second capacitor Cpd 220. In one preferred example, the first clamping circuitry 224 includes a first diode 226 with a cathode terminal coupled to the first terminal of the second capacitor Cpd 220 and an anode terminal coupled to the ground terminal, such that a voltage at the first terminal of the second capacitor Cpd 220 is clamped above a first particular voltage by the first diode 226 to prevent the second current signal Is from charging the first capacitor 208. In a preferred example, the timer control circuitry 202 includes a second resistor 228 coupled in parallel with the second capacitor Cpd 220. The second resistor 228 is configured to provide a slower discharge path to more slowly discharge the second capacitor Cpd 220, in order to keep the DC-DC converter system 100 in a stable status when the minimum duration Toff_min dominates the actual duration Toff of the second state of the first switch 102.

In another preferred example, the charge pump circuitry 214 also includes a second clamping circuitry 229 including a second diode 230 (having an anode terminal coupled to the first terminal of the second capacitor Cpd 220 and a cathode terminal coupled to a voltage supply), such that a voltage at the first terminal of the second capacitor Cpd 220 is clamped below a second particular voltage (based on the voltage supply and the threshold voltage of the second diode 230) to clamp the second current signal Is below a maximum value based on the second particular voltage, so as to limit the switching frequency Fsw of the DC-DC converter system 100 above a particular minimum value.

Figure 3A:
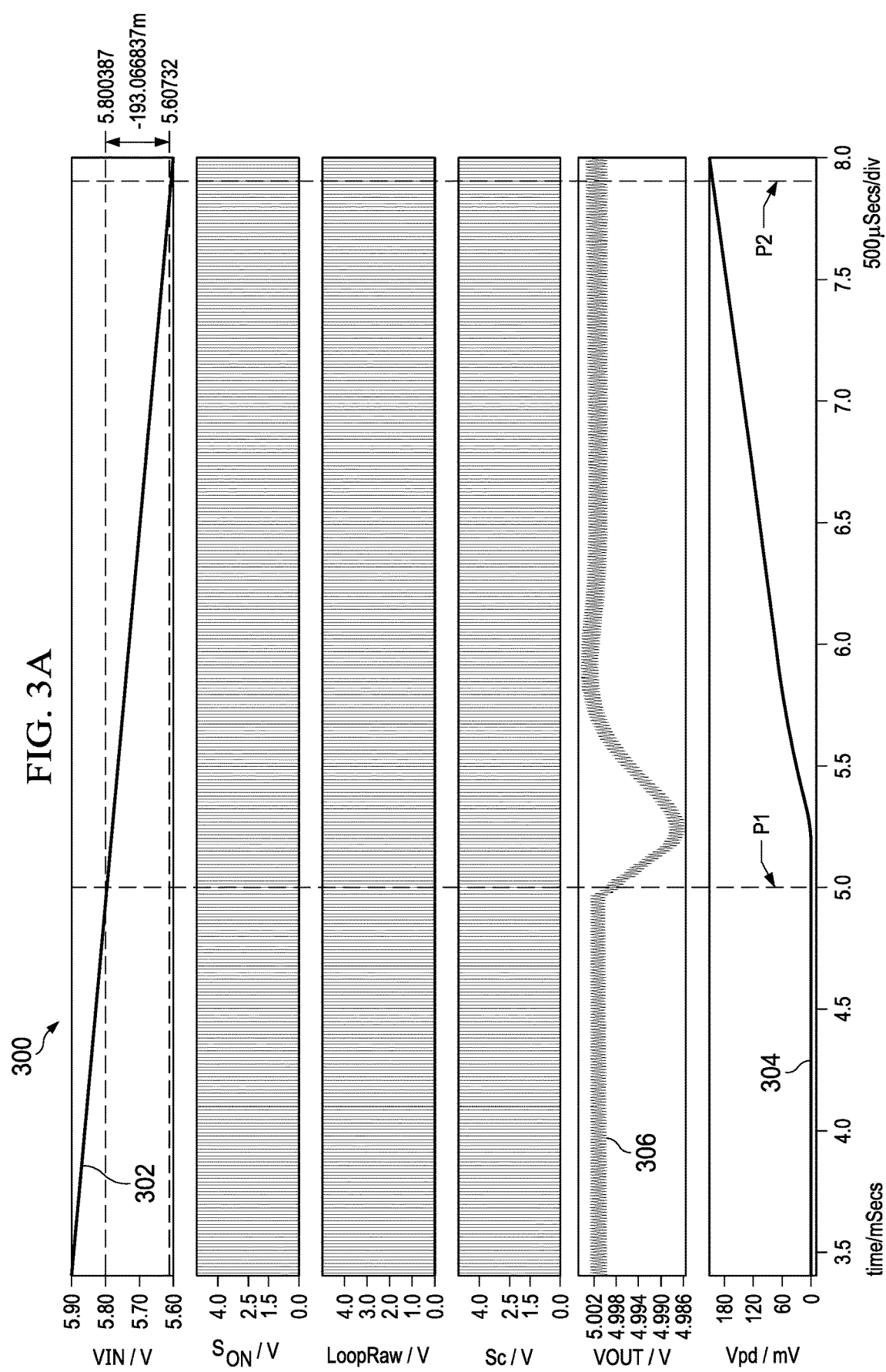
FIGS. 3A, 3B, 3C and 3D are diagrams of simulation waveforms of a DC-DC converter of FIG. 1.
Figure 3B:
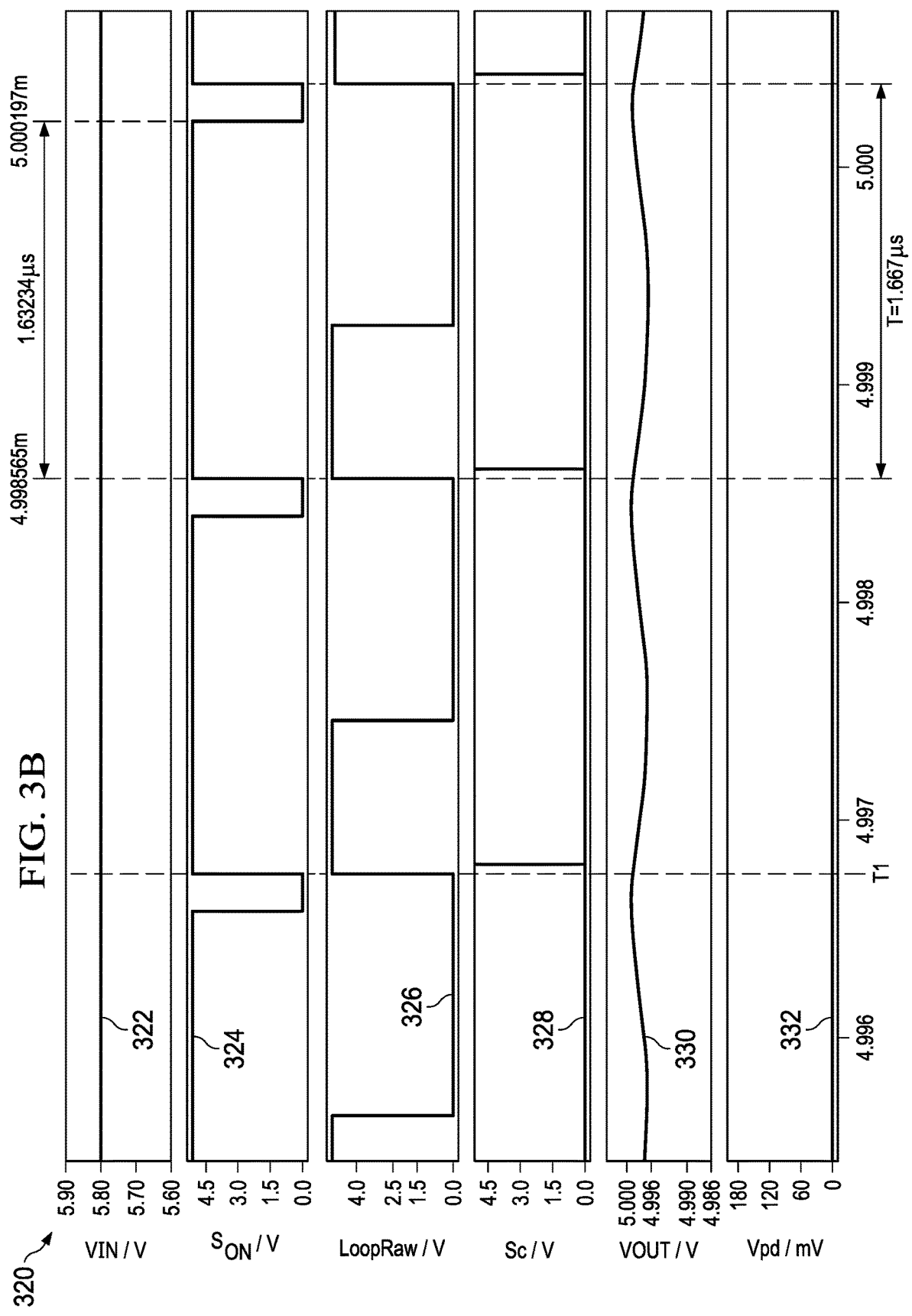
Figure 3C:
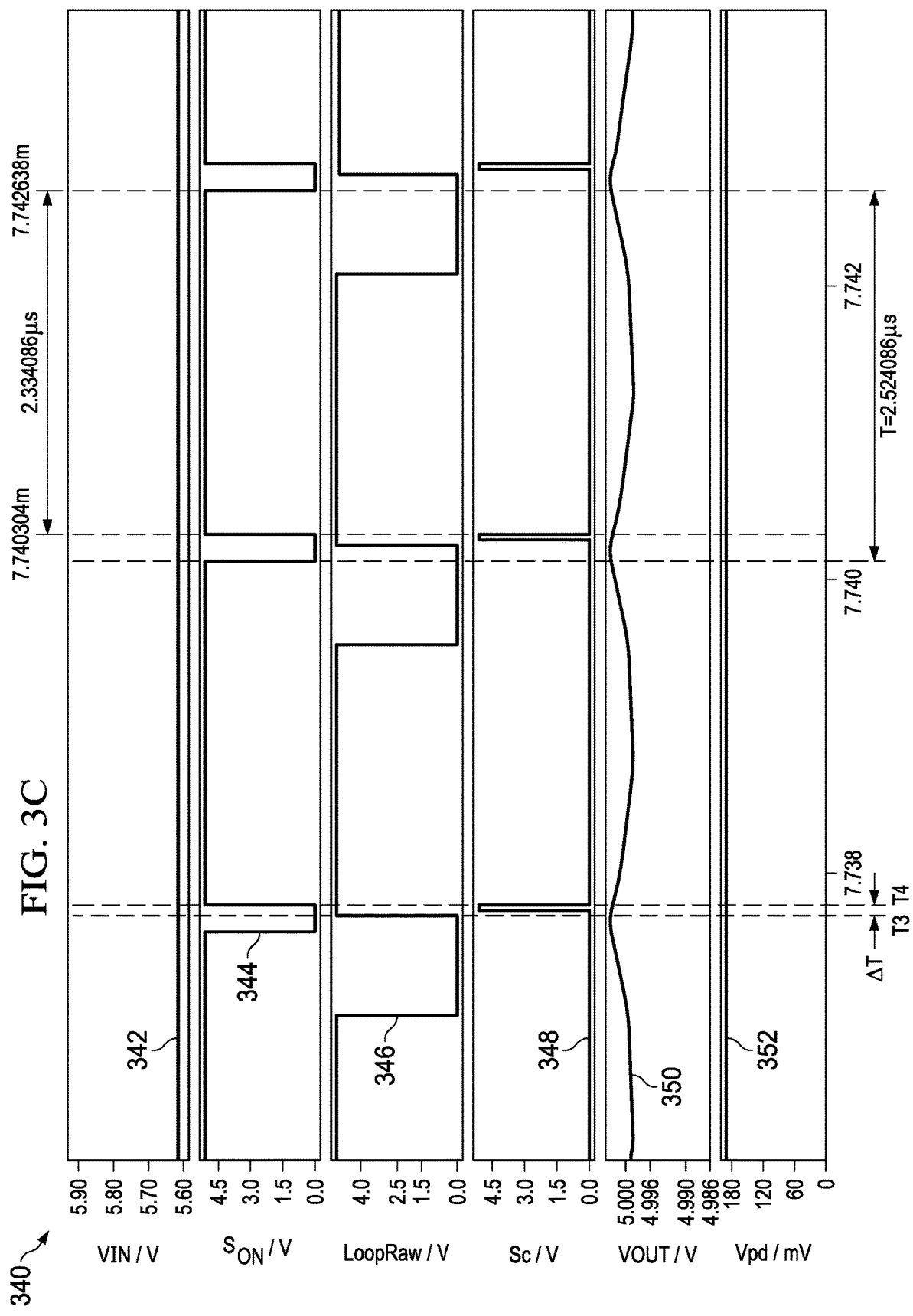

FIG. 3A is a diagram 300 of simulation waveforms of a DC-DC converter system 100 of FIG. 1 during an input voltage VIN transition state, with a target output voltage VOUT_target set as 5V, a target switching frequency Fsw_target set at about 600 kHz, and the minimum off-time Toff_min set at 190 ns. The input voltage VIN 302 of the DC-DC converter system 100 decreases from a voltage level relatively higher than the target output voltage VOUT_target to a voltage slightly higher than the target output voltage VOUT_target. FIG. 3B is a partially enlarged diagram 320 of the simulation waveforms of FIG. 3A during a first period P1 when the input voltage VIN is relatively higher than the target output voltage VOUT_target. FIG. 3C is a partially enlarged diagram 340 of the simulation waveforms of FIG. 3A during a second period P2 when the input voltage VIN is slightly higher than the target output voltage VOUT_target.

As shown in FIG. 3A, with reference to FIG. 1, with the decrease of the input voltage VIN, the minimum duration Toff_min begins to dominate the actual duration Toff of the second state of the first switch 102, and the phase difference between the control signal $S_{ON}$ and the loop control signal LoopRaw increases. As described above, the phase difference is detected and converted to the charging signal Sc to charge the second capacitor Cpd 220. A voltage Vpd 304 across the second capacitor Cpd 220 increases proportionally with the increase of the phase difference. The voltage Vpd 304 is converted to the second current signal Is to discharge the first capacitor 208 when the first switch 102 is in the first state, in order to extend the first duration Ton of the first state of the first switch 102. As the actual second duration Toff is fixed based on the minimum duration Toff_min, the switching cycle Tsw is extended. The switching duty cycle of the system 100 is increased to maintain the output voltage VOUT at the target output voltage VOUT_target.

As shown in FIG. 3B, when the input voltage VIN is around 5.8V (which is relatively higher than the target output voltage VOUT_target): the target second duration Toff of the second state of the first switch 102 (determined by the loop control circuitry 112) is greater than the minimum duration Toff_min; and the first control signal $S_{ON}$ is asserted substantially simultaneously with the assertion of the loop control signal LoopRaw. At time T1, the control signal $S_{ON}$ 324 is asserted responsive to and substantially simultaneously with assertion of the loop control signal LoopRaw 326. The charging signal 328 is a substantially periodic impulse signal due to a delay of the control logic 114. The output voltage VOUT 330 remains substantially around 5V, and the voltage Vpd 332 at the first terminal of the second capacitor Cpd 220 remains at 0V, because no current is charged to the second capacitor Cpd 220. The first duration Ton is about 1.632 μs.

As shown in FIG. 3C, when the input voltage VIN 342 reduces to about 5.6V, which is relatively nearer the target output voltage VOUT_target, the first control signal $S_{ON}$ is asserted after the assertion of the loop control signal LoopRaw, because the target second duration Toff_target of the second state of the first switch 102 (determined by the loop control circuitry 112) is smaller than the minimum duration Toff_min. Therefore, the minimum duration Toff_min dominates the actual second duration Toff of the second state of the first switch 102. At time T3: the loop control signal LoopRaw 346 is asserted; and due to the minimum off-time control, the control signal $S_{ON}$ 344 is later asserted at time T4, with a phase difference ΔT relative to the loop control signal LoopRaw 346. Responsive to the phase difference ΔT, the charging signal Sc 348 is asserted for a period of time, which enables the first current source Ic to charge the second capacitor Cpd, and the voltage Vpd 352 is thereby increased. As described above, the voltage Vpd 352 is converted to a second current source Is to discharge the first capacitor Cs 208 when the first switch 102 is at the on state, thereby extending the first duration Ton of the first switch 102. As shown in FIG. 3C, the first duration Ton is extended to about 2.334 μs, so the output voltage VOUT 350 remains substantially around 5V. The switching cycle Tsw is extended to about 2.524 μs, so the switching frequency Fsw is lowered to about 400 kHz.

Figure 3D:
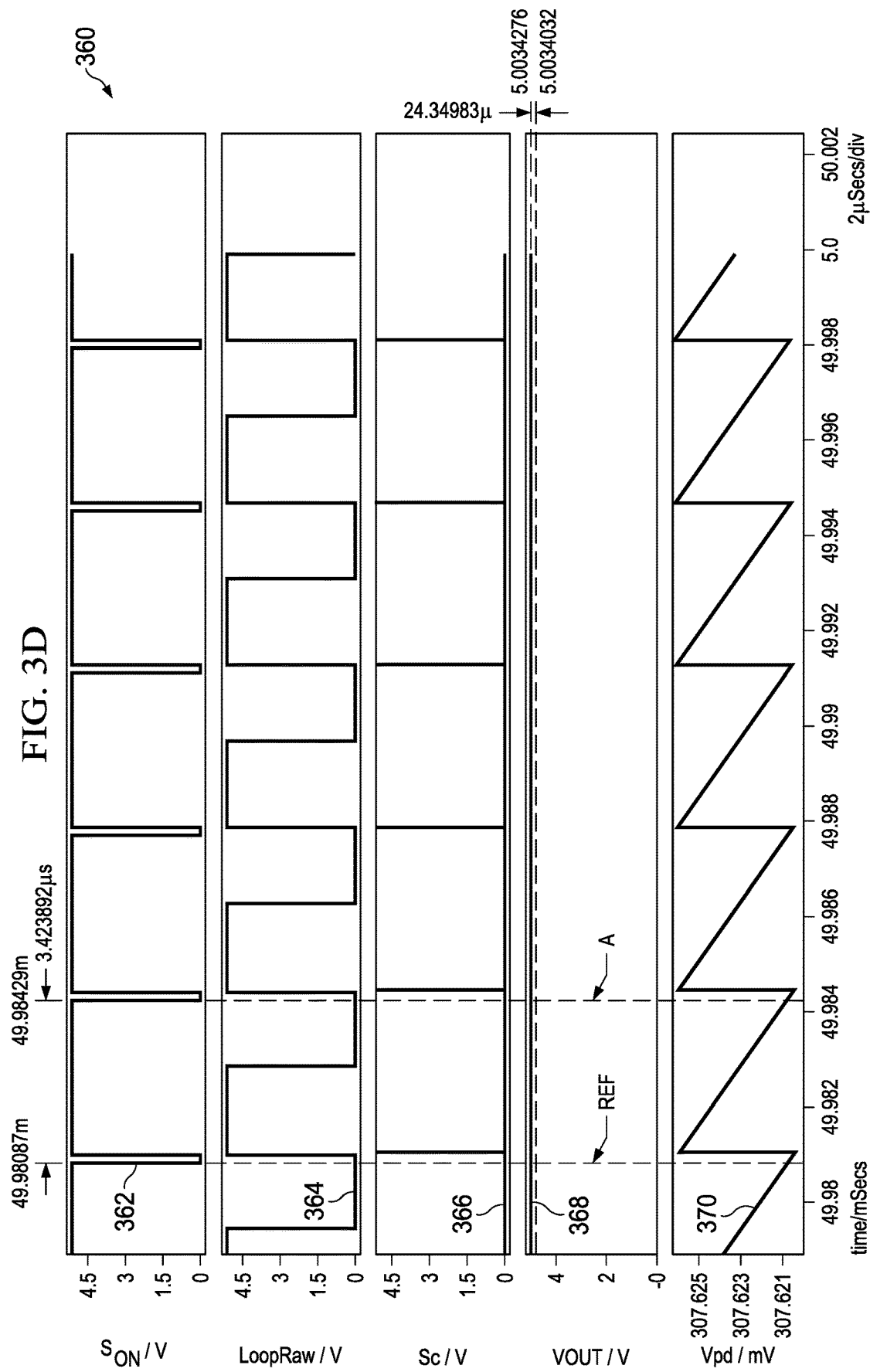

FIG. 3D is a diagram 360 of simulation waveforms of a DC-DC converter system 100 of FIG. 1 in an input voltage VIN stable state, with an input voltage VIN set as 5.5V, a target output voltage VOUT_target=5V, a target switching frequency Fsw_target being about 600 kHz, and the minimum off-time Toff_min being 190 ns. In the stable state, by extending the first duration Ton of the first switch 102 as described with reference to FIG. 1, the output voltage VOUT 368 is maintained substantially at the target output voltage 5V, and the switching frequency Fsw decreases to 292 KHz. The control signal $S_{ON}$ 362 is asserted substantially simultaneously with assertion of the loop control signal LoopRaw 364, and the charging signal Sc 366 is again a substantially periodic impulse signal due to a delay of the control logic 114, which causes the voltage Vpd 370 to increase. The voltage Vpd 370 then decreases through the discharge path provided by the second resistor 228.

Figure 4:
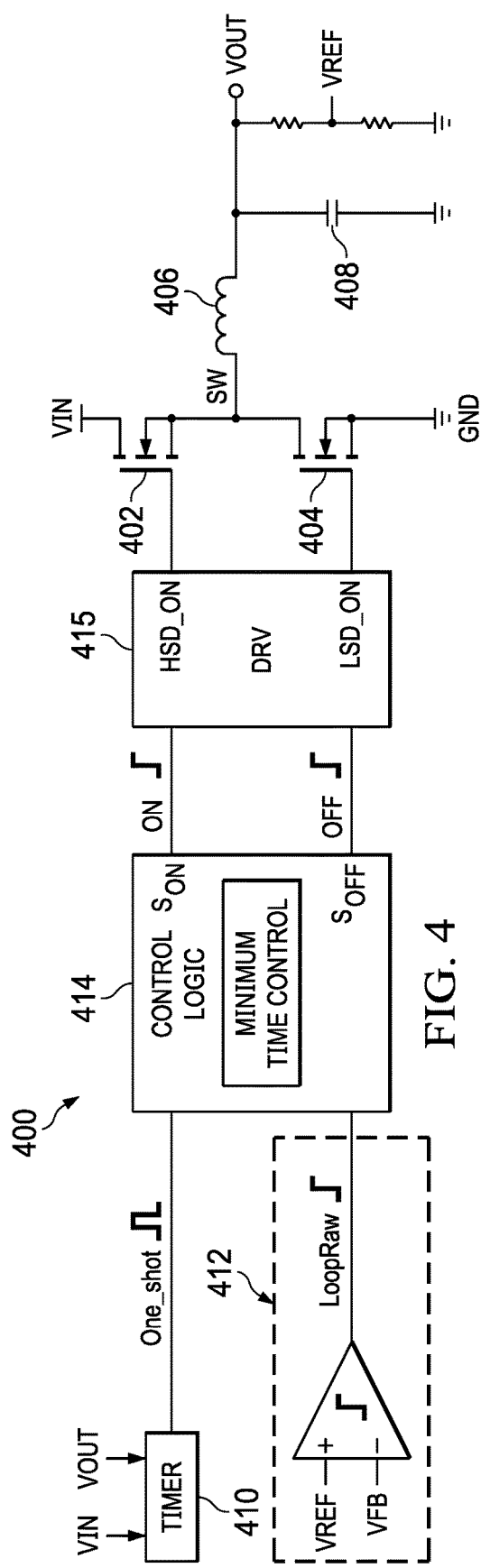
FIG. 4 is a schematic block diagram of an adaptive on-time buck DC-DC converter system.

FIG. 4 is a schematic block diagram of an adaptive on-time buck DC-DC converter system 400. The system 400 is substantially similar to the system 100 of FIG. 1, except the system 400 does not include the timer control circuitry 116 of the system 100. The control logic 414 is configured to: (a) switch off the first switch 402 based on the timing signal One_shot, which is generated by the timer circuitry 410 based on the input and output voltages VIN and VOUT and a target switching frequency Fsw_target of the system 400; and (b) switch on the first switch 402 based on the minimum duration of the off state of the first switch and the loop control signal LoopRaw. The loop control signal LoopRaw is generated by the loop control circuitry 412 based on a difference between: a feedback voltage proportional to the output voltage VOUT; and the particular reference voltage VREF.

Figure 5:
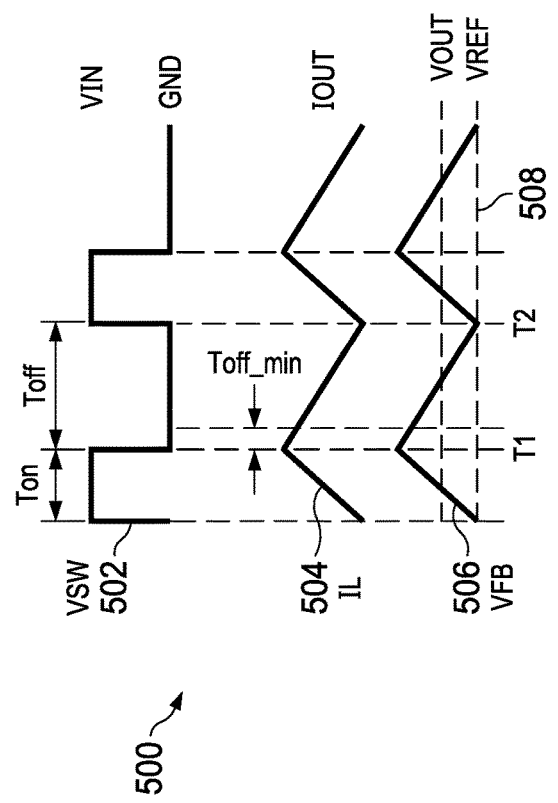
FIG. 5 is an illustrative diagram of waveforms of the DC-DC converter of FIG. 4.

FIG. 5 is an illustrative diagram 500 of waveforms of the DC-DC converter 400 of FIG. 4. The voltage VSW 502 at the switching terminal SW is switched to the input voltage VIN during the first duration Ton of the first switch 402. The inductor current IL 504 through the inductor 406 and the feedback voltage VFB 506 ramp up. At time T1, the timer circuitry 410 expires, which causes the first switch 402 to be off. The voltage VSW 502 at the switching terminal SW is switched to ground GND during the second duration Toff of the first switch 402. The inductor current IL 504 through the inductor 406 and the feedback voltage VFB 506 ramp down. At time T2, the feedback voltage VFB 506 drops to the particular reference voltage VREF 508. When the input voltage VIN is sufficiently higher than the target output voltage VOUT_target, the second duration Toff is greater than a minimum duration Toff_min of the second state of the first switch 402, and the first switch 402 is switched on again at time T2.

Figure 6A:
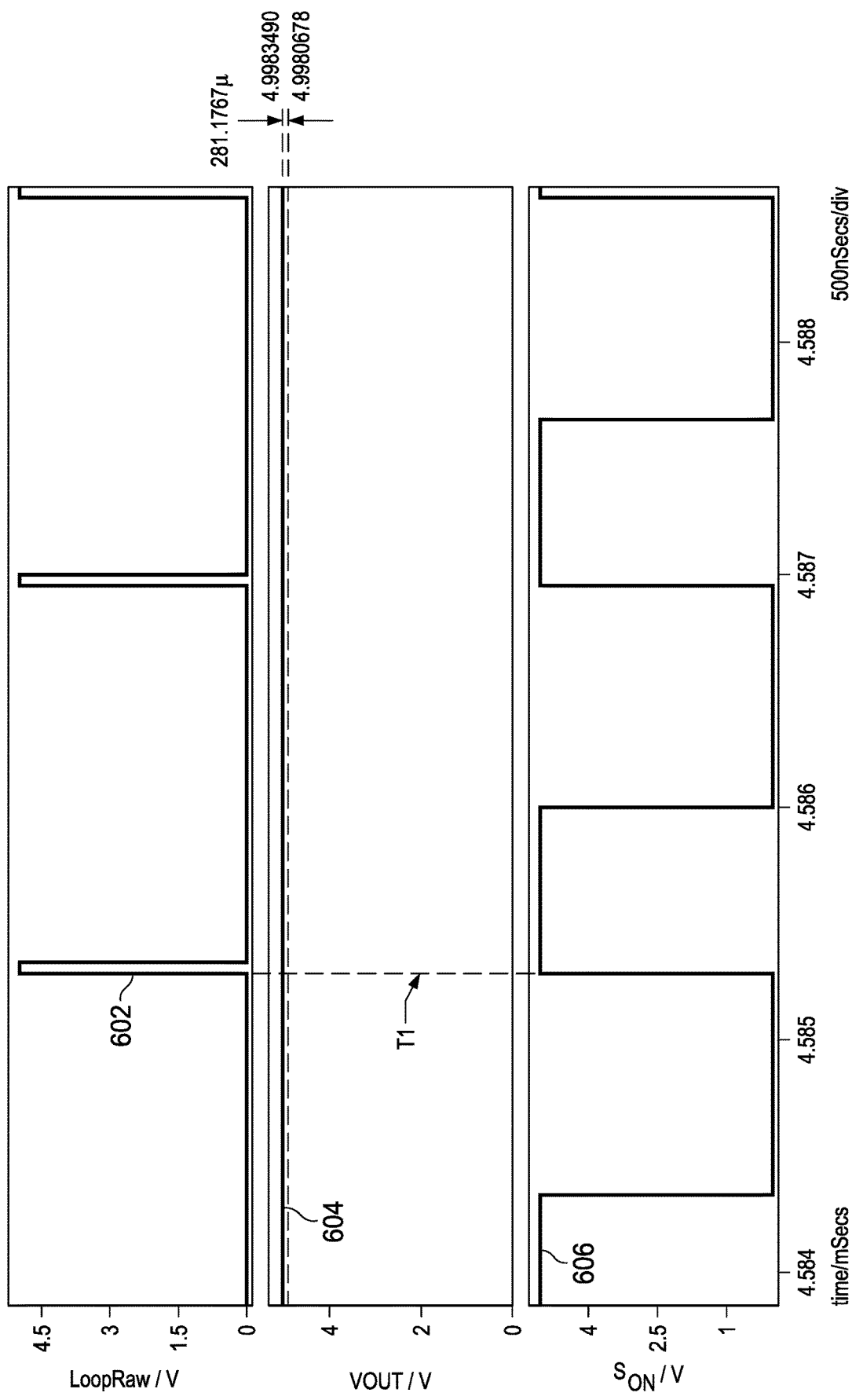
FIGS. 6A and 6B are diagrams of simulation waveforms of the DC-DC converter of FIG. 4.

FIG. 6A is a diagram 600 of simulation waveforms of a DC-DC converter of FIG. 4 when the input voltage VIN is relatively higher than a target output voltage VOUT, where a second duration Toff of the second state of the first switch 102 (determined by the loop control circuitry 412) is greater than the minimum duration Toff_min. In FIG. 6A, the input voltage VIN is 12V, a target output voltage is set to be 5V, a target switching frequency Fsw_target is about 600 kHz, and the minimum off-time Toff_min is 190 ns. At time T1, the control signal $S_{ON}$ 606 is asserted responsive to and substantially simultaneously with assertion of the loop control signal LoopRaw 602. The output voltage VOUT 604 remains substantially around 5V.

Figure 6B:
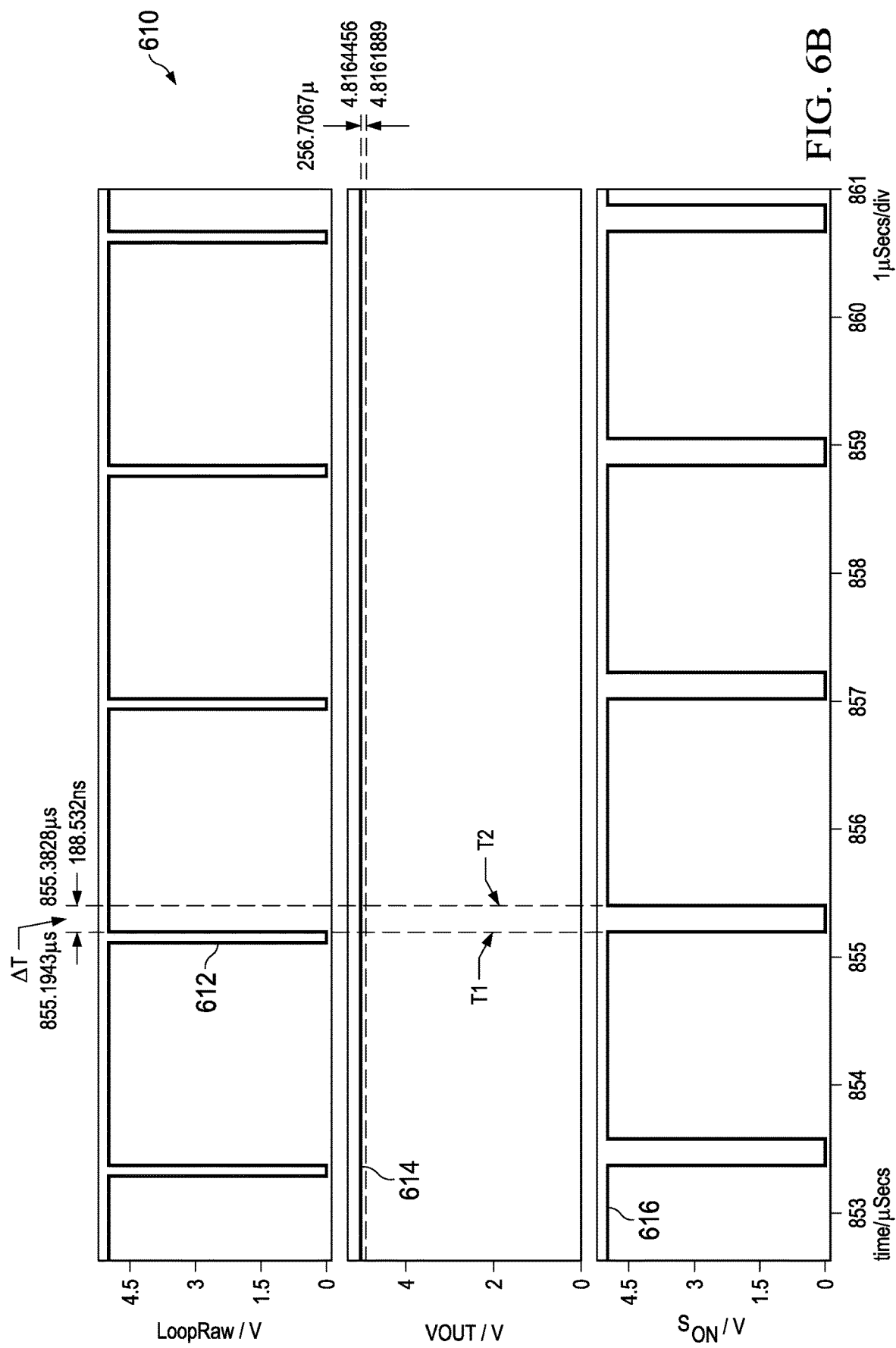

FIG. 6B is a diagram 610 of simulation waveforms of a DC-DC converter of FIG. 4 when the input voltage VIN is relatively near the target output voltage VOUT, where a second duration Toff of the second state of the first switch 402 (determined by the loop control circuitry 412) is smaller than the minimum duration Toff_min. In FIG. 6B, the input voltage VIN reduces to 5.6V, and the target output voltage is still set to be 5V. At time T1: (a) the loop control signal LoopRaw 612 is asserted; and due to the minimum off-time control, the control signal $S_{ON}$ 616 is later asserted at time T2, with a phase difference ΔT relative to the loop control signal LoopRaw 612. Therefore, the actual second duration Toff of the first switch 402 is greater than the target second duration Toff_target (determined based on the loop control signal LoopRaw 612), the first switch 402 is switched from the second state to the first state later than the assertion of the loop control signal LoopRaw 612, and with the increasing of the actual second duration Toff, the first duration Ton is not large enough to provide sufficient energy through the inductor 406. Decreasing of the switching duty cycle of the system 400 causes the output voltage VOUT 614 to drop to about 4.81V.

Figure 7:
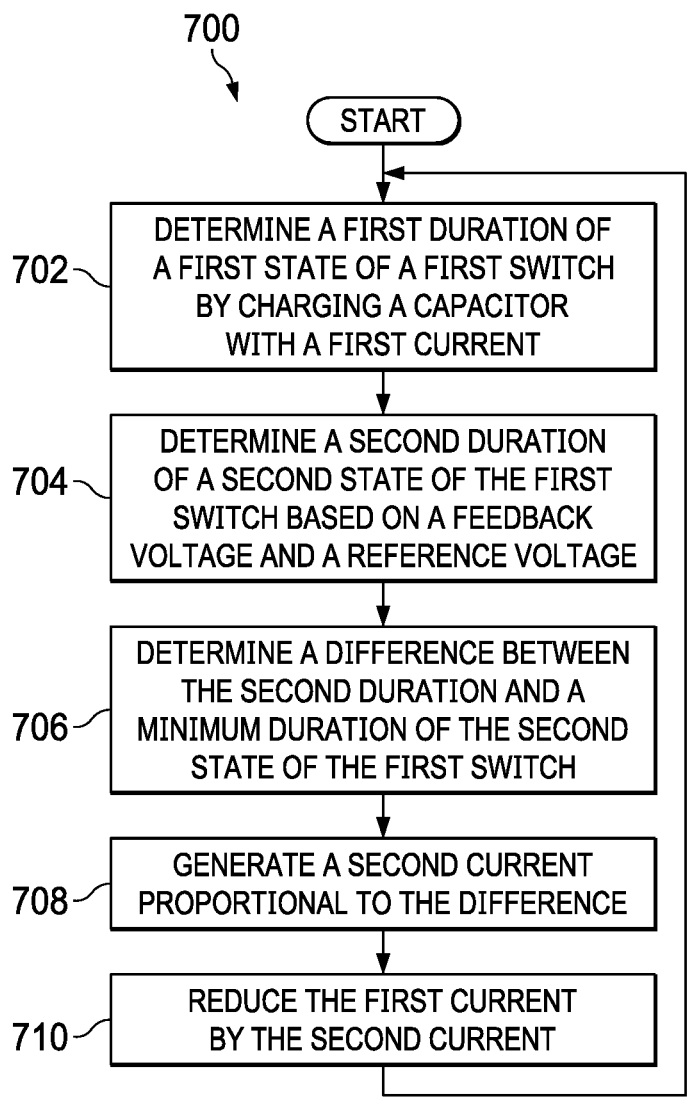
FIG. 7 is a flow chart of a method of operating a DC-DC converter system in accordance with an implementation of this description.

FIG. 7 is a flow chart of a method of operating a DC-DC converter system in accordance with an implementation of this description.

Starting at step 702, with reference to the DC-DC converter system 100 of FIG. 1, and the timer circuitry 200 and timer control circuitry 202 of FIG. 2, the timer circuitry 110 determines a first duration Ton of a first state (e.g. an on state) of the first switch 102 by charging the first capacitor Cs 208 with a charging current $I_0$ to a voltage K·OUT, which is proportional to the output voltage VOUT when the first switch 102 is on. The charging current $I_0$ is generated based on the input voltage VIN. The timer circuitry 110 generates a timing signal One_shot to switch the first switch 102 from the first state to a second state (e.g. an off state) when the first duration Ton expires. The first capacitor Cs 208 is discharged to ground when the first switch 102 is off.

At step 704, the loop control circuitry 112: (a) determines a target second duration Toff_target of the second state of the first switch 102, based on a feedback voltage VFB proportional to the output voltage VOUT and based on a particular reference voltage VREF; and (b) generates a loop control signal LoopRaw to switch the first switch 102 from the second state to the first state.

At step 706, the control logic 114 generates a first control signal $S_{ON}$ based on the loop control signal LoopRaw and a minimum duration Toff_min of the second state of the first switch 102. In one example, the first control signal $S_{ON}$ is asserted when the loop control signal LoopRaw is asserted and the minimum duration Toff_min expires.

At step 708, the phase detector 212 of the timer control circuitry 202 detects a phase difference between the loop control signal LoopRaw and the first control signal $S_{ON}$. In one example, the phase detector 212 generates a charging signal Sc with a duration based on the phase difference.

At step 710, the charge pump circuitry 214 generates a second current Is proportional to the duration of the charging signal Sc. In one example, the charge pump circuitry 214 includes: (a) a first current source Ic configured to charge a second capacitor Cpd 220 based on the charging signal Sc, in order to generate a voltage Vpd at a first terminal of the capacitor Cpd 220; and (b) a transconductance amplifier 222 configured to convert the voltage Vpd to the second current Is. In one example, the voltage Vpd is clamped: (a) above a first particular voltage level to prevent the second current Is from charging the first capacitor Cs 208; and (b) below a second particular voltage level to limit the switching frequency Fsw of the DC-DC converter system 100 above a particular minimum value.

At step 712, the first capacitor Cs 208 is discharged by the second current Is when the first switch is on, such that the current charged to the first capacitor Cs 208 is reduced to extend the first duration Ton of the first switch 102. Therefore, in the converter system 100, when the minimum duration Toff_min dominates the actual duration Toff of the second state of the first switch 102; (a) the actual second duration Toff of the converter system 100 is fixed based on the minimum duration Toff_min; (b) the first duration Ton is extended proportionally to the phase difference; and (c) the switching frequency Fsw of the DC-DC converter system 100 decreases smoothly.

In this description, the term "couple" may cover connections, communications, or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C, if intervening component C does not alter the functional relationship between device A and device B, such that device B is controlled by device A via the control signal generated by device A.

Modifications are possible in the described examples, and other examples are possible, within the scope of the claims.

What is claimed is:

1. A voltage converter system, comprising:
    a switch configured to switch between first and second states responsive to a first control signal;
    timer circuitry configured to generate a timing signal representing a duration of the first state based on input and output voltages of the voltage converter system;
    control logic coupled to the switch and the timer circuitry, and configured to generate the first control signal based on a second control signal, in which the second control signal is based on a feedback voltage and a reference voltage; and
    timer control circuitry coupled to the control logic and the timer circuitry, and configured to: detect a phase difference between the first control signal and the second control signal; and adjust the timer circuitry to change the duration based on the phase difference.

2. The voltage converter system of claim 1, further comprising:
    loop control circuitry having a comparator configured to generate the second control signal based on the feedback voltage and the reference voltage.

3. The voltage converter system of claim 2, wherein the comparator is a first comparator, and the timer circuitry comprises:
    a second comparator having: a first input configured to receive the output voltage; a second input; and a comparator output at which the second comparator is configured to provide the timing signal; and
    a capacitor coupled to the second input and configured to receive a current.

4. The voltage converter system of claim 3, wherein:
    the current is a first current;
    the timer control circuitry comprises a phase detector configured to: receive the first control signal and the second control signal; and generate a charging signal based on a phase difference between the first control signal and the second control signal; and
    the timer control circuitry is configured to generate a second current based on the charging signal.

5. The voltage converter system of claim 4, wherein the timer control circuitry comprises:
    a control switch configured to receive the charging signal; and
    an amplifier coupled to the switch and configured to provide the second current.

6. The voltage converter system of claim 5, wherein the capacitor is configured to receive the first current offset by the second current, and delay a change of the first control signal.

7. The voltage converter system of claim 5, wherein the capacitor is a first capacitor, and the timer control circuitry comprises:
    a current source; and
    a second capacitor coupled to the amplifier, wherein the control switch is coupled between the current source and the second capacitor.

8. The voltage converter system of claim 7, wherein the timer control circuitry comprises:
    clamping circuitry coupled to the second capacitor, and configured to clamp a voltage at the second capacitor within a voltage range.

9. The voltage converter system of claim 4, wherein the phase detector comprises a D flip-flop having: a data input configured to receive the second control signal; a clock input configured to receive the first control signal; and a flip-flop output at which the D flip-flop is configured to provide the charging signal.

10. A controller for a voltage converter system having a switch configured to switch between first and second states responsive to a first control signal, the controller comprising:
timer circuitry configured to generate a timing signal representing a duration of the first state based on input and output voltages of the voltage converter system;
control logic coupled to the timer circuitry and adapted to be coupled to the switch, and configured to generate the first control signal based on a second control signal, in which the second control signal is based on a feedback voltage and a reference voltage; and
timer control circuitry coupled to the control logic and the timer circuitry, and configured to: detect a phase difference between the first control signal and the second control signal; and adjust the timer circuitry to change the duration based on the phase difference.

11. The controller of claim 10, wherein the timer circuitry comprises:
a comparator having: a first input configured to receive the output voltage; a second input; and a comparator output at which the comparator is configured to provide the timing signal; and
a capacitor coupled to the second input and configured to receive a current.

12. The controller of claim 11, wherein:
the current is a first current;
the timer control circuitry comprises a phase detector configured to: receive the first control signal and the second control signal; and generate a charging signal based on a phase difference between the first control signal and the second control signal; and
the timer control circuitry is configured to generate a second current based on the charging signal.

13. The controller of claim 12, wherein the timer control circuitry comprises:
a control switch configured to receive the charging signal; and
an amplifier adapted to be coupled to the switch and configured to provide the second current.

14. The controller of claim 13, wherein the capacitor is configured to receive the first current offset by the second current, and delay a change of the first control signal.

15. The controller of claim 13, wherein the capacitor is a first capacitor, and the timer control circuitry comprises:
a current source; and
a second capacitor coupled to the amplifier, wherein the control switch is coupled between the current source and the second capacitor.

16. The controller of claim 15, wherein the timer control circuitry comprises:
clamping circuitry coupled to the second capacitor, and configured to clamp a voltage at the second capacitor within a voltage range.

17. The controller of claim 12, wherein the phase detector comprises a D flip-flop having: a data input configured to receive the second control signal; a clock input configured to receive the first control signal; and a flip-flop output at which the D flip-flop is configured to provide the charging signal.

* * * * *